United States Patent
Koshimae et al.

(10) Patent No.: US 6,931,048 B2
(45) Date of Patent: Aug. 16, 2005

(54) SOLID-STATE LASER DEVICE

(75) Inventors: Toshiki Koshimae, Tokyo (JP);
Toshiaki Watanabe, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 251 days.

(21) Appl. No.: 10/048,233

(22) PCT Filed: Dec. 27, 2000

(86) PCT No.: PCT/JP00/09320

§ 371 (c)(1),
(2), (4) Date: Jan. 28, 2002

(87) PCT Pub. No.: WO02/056433

PCT Pub. Date: Jul. 18, 2002

(65) Prior Publication Data

US 2002/0150139 A1 Oct. 17, 2002

(51) Int. Cl.$^7$ ............................................. H01S 3/091

(52) U.S. Cl. .................... 372/75; 372/29.01; 372/29.02; 372/38.1

(58) Field of Search ............................... 372/75, 29.01, 372/29.02

(56) References Cited

U.S. PATENT DOCUMENTS 6,255,707 B1 * 7/2001 Bylsma et al. ............... 257/414
6,574,257 B1 * 6/2003 Thronton et al. .............. 372/46

FOREIGN PATENT DOCUMENTS

| JP | 5-343809 | 12/1993 | |
|---|---|---|---|
| JP | 08136356 A | * 5/1996 | ............ G01K/7/01 |
| JP | 8-25833 | 10/1996 | |

* cited by examiner

Primary Examiner—Minsun Oh Harvey
Assistant Examiner—Dung Nguyen
(74) Attorney, Agent, or Firm—Sughrue Mion, PLLC

(57) ABSTRACT

According to the present invention, there is provided a solid-state laser diode comprising:
  a laser diode for exciting a solid laser medium;
  a constant current source for supplying a constant current to the laser diode;
  voltage measurement unit for measuring a voltage at both ends of the laser diode; and
  abnormality detection unit for detecting an abnormality at the laser diode based on an output of the voltage measurement unit. Whereby a photodiode need not be arranged on the periphery of the solid laser medium and the laser diode, and an abnormality at the laser diode can be detected without increasing the size of the device and complicating the device and without deteriorating the laser emission efficiency.

6 Claims, 7 Drawing Sheets

SOLID-STATE LASER DEVICE

TECHNICAL FIELD

The present invention relates to a solid-state laser device and in particular to detection of an abnormality at a laser diode thereof.

BACKGROUND ART

FIG. 8 is a diagram showing a structure of a common solid-state laser device according to a related art. A direct current flows to a laser diode 1 to emit light, a laser medium 2 is excited, and resonance occurs between a total reflection mirror 3 and a partially reflection mirror 4, so that laser light is obtained. The thus obtained laser light is expanded in parallel by using an enlargement lens 5 and a parallel lens 6, and is condensed at an end face of an optical fiber 8 by using an optical fiber incident lens 7. The condensed laser light passes through the optical fiber 8 and is guided to a predetermined location through a working head 9.

FIG. 9 is a schematic diagram showing a structure of a portion where the solid laser medium (hereinafter referred to as a laser medium, as needed) 2 is excited by the laser diode 1. A plurality of laser diodes 1 (1a, 1b, 1c and 1d) are connected in series to a direct current power source 10, and apply excitation light to the cylindrical laser medium 2 via a light guide 11. The excitation light may be applied directly to the laser medium 2 without using the light guide 11. Since a current is used to control the output of the laser diode 1, a direct current power source for controlling the current is frequently employed as the direct current power source 10.

The output level of one laser diode 1 is several tens of W; however, since the output required for the entire solid-state laser device is several hundred W to several kW, it is not rare for several tens of laser diodes 1 to be connected in series.

In this example, the excitation light supplied by the laser diode 1 is applied from one direction. However, as is shown in FIG. 10, the laser diodes 1 (1a, 1b, 1c and 1d) may be arranged at 90 degree intervals, and the laser medium 2 is irradiated in four directions by the excitation light.

While the laser diode 1 is in use, due to occurrence of an abnormality, such as a short or an open circuit fault, no current may flow and no excitation light may be emitted from the laser diode 1. In order to detect an abnormal state (hereinafter referred to as a "fault", as needed) wherein no excitation light is emitted from the laser diode 1, the following method is conventionally employed.

One of the laser diodes 1 used for the solid-state laser device generates excitation light to provide heat having several tens of W. For the detection of a fault at a laser diode 1 in the mW order for image formation, as is shown in FIG. 11 the excitation light emitted from the laser diode 1 is measured using a photodiode 16, and the fault is detected by a light intensity measuring unit 17 and a fault detector 18.

In this arrangement, the photodiode 16 must be provided in addition to the laser diode 1. Since it is necessary that the exciting of the laser medium 2 is performed as efficiently as possible, the laser diode 1 is arranged to be near the laser medium 2 and the light guide 11. Thus, it is very difficult to ensure a location where the photodiode 16 is arranged, and design thereof is also difficult. In addition, it is necessary that a part of the excitation light generated by the laser diode 1 is fetched in the photodiode 16, and thus, since all the excitation light emitted from the laser diode 1 can not be applied to the laser medium 2, efficiency is deteriorated.

As is described above, in the arrangement of the photodiode 16, etc., there is a problem that the device becomes complicated and the irradiation efficiency is reduced. Therefore, in the laser diode 1 used for a solid-state laser device, generally, the current input to the laser diode 1 is employed to determine whether excitation light emitted from the laser diode 1 is irradiated. Specifically, a status of the current flowing to the laser diode 1 is fed back to a controller (not shown). When there is no current flow, it is determined that an open fault occurs at the laser diode 1, or when there is an overcurrent flow, it is determined that a short circuit occurs at the laser diode 1, so that no emission of excitation light by the laser diode 1 is detected.

FIG. 12 is a voltage-current characteristic graph for a laser diode. When, for the above described current feedback method, a commonly used power source of a current control type is employed as the power source, even if a short circuit occurs at the laser diode, the resistance does not become 0 Ω due to line resistance and a constant current is maintained (set to a state at point E in FIG. 12). Further, since there is no overcurrent flow, the detection of a fault cannot be performed. Furthermore, when an open fault has occurred, the flow of the current is halted and the fault can be detected. However, generally, since several tens of laser diodes are connected in series to provide a large output, if an open fault has occurred at one of them, it is difficult to pinpoint which one of the laser diodes is opened.

As is described above, so long as a commonly used power source of a current control type is employed, the solid-state laser device according to a related art can not detect that emission of excitation light has been halted due to a short-circuit at a laser diode. Further, when a plurality of laser diodes are employed, it is difficult to pinpoint which one of the laser diodes is in fault.

To resolve the above problems, it is one objective of the present invention to provide a solid-state laser device that can detect, without using a photodiode, a state where a laser diode is not emitting excitation light, and at the same time, can easily pinpoint which one of the laser diodes is in fault.

DISCLOSURE OF THE INVENTION

According to the present invention, there is provided a solid-state laser diode comprising:

a laser diode for exciting a solid laser medium;

a constant current source for supplying a constant current to the laser diode;

voltage measurement unit for measuring a voltage at both ends of the laser diode; and abnormality detection unit for detecting an abnormality at the laser diode based on an output of the voltage measurement unit.

Therefore, another member such as a photodiode need not be arranged on a periphery of the solid laser medium and the laser diode, and the abnormality at the laser diode can be detected without increasing the size of the device and complicating the device, and without deteriorating the laser emission efficiency because of absorption of a part of the excitation light by the photodiode.

Further, according to the present invention, there is provided a solid-state laser device comprising:

a plurality of laser diodes connected in series, for exciting a solid laser medium;

a constant current source for supplying a constant current to the laser diodes;

voltage measurement unit for measuring the voltage at both ends of the laser diodes; and abnormality detection unit for detecting an abnormality at the laser diodes based on the output of the voltage measurement unit.

Therefore, an abnormality of the plurality of laser diodes can be detected without increasing the size of the device and complicating the device and without deteriorating the laser emission efficiency.

According to the present invention, there is provided the solid-state laser device wherein the voltage measurement means measures the voltage of the plurality of laser diodes individually to output the individual measured voltage to the abnormality detection means.

Therefore, in a case where two or more laser diodes are connected in series, it can be pointed out that which one of the laser diodes is detected the abnormality.

In addition, according to the present invention, there is provided the solid-state laser device, wherein when n (n is a natural number equal to or greater than four) laser diodes are connected, the voltage measurement unit measures the voltages of sets including m laser diodes (m is a natural number smaller than n) individually to output the voltages to abnormality detection unit.

Thus, in a case where a large number of laser diodes are connected in series, it can be determined that which one of laser diode pairs includes a laser diode a laser diode detected the abnormality.

Furthermore, according to the present invention, there is provided the solid-state laser device, wherein a normal range having a finite width defined an upper limit value and a lower limit value as reference values of the voltage for determining abnormality of the laser diode is set; and when the voltages at the laser diodes measured by the voltage measurement unit are equal to or higher than the upper limit value or equal to or lower than the lower limit value, the abnormality detection unit outputs an abnormality detection signal.

Therefore, the voltage generated at both ends of the laser diode differs depending on a supplied current or a difference in individual laser diodes. However, the upper limit value and the lower limit value are set to be the range, thereby enabling to prevent an erroneous determination of the abnormality for a normal laser diode.

Moreover, according to the present invention, there is provided the solid-state laser device further comprising:

reference value change unit for changing the normal range for the measured voltage set at the abnormality detection unit on a basis of an input current value.

Therefore, in a case that the current value is constantly changed, it is possible to prevent the erroneous determination of the abnormality for a normal laser diode.

BEST MODES FOR CARRYING OUT THE INVENTION

Embodiment 1

Figure 1:
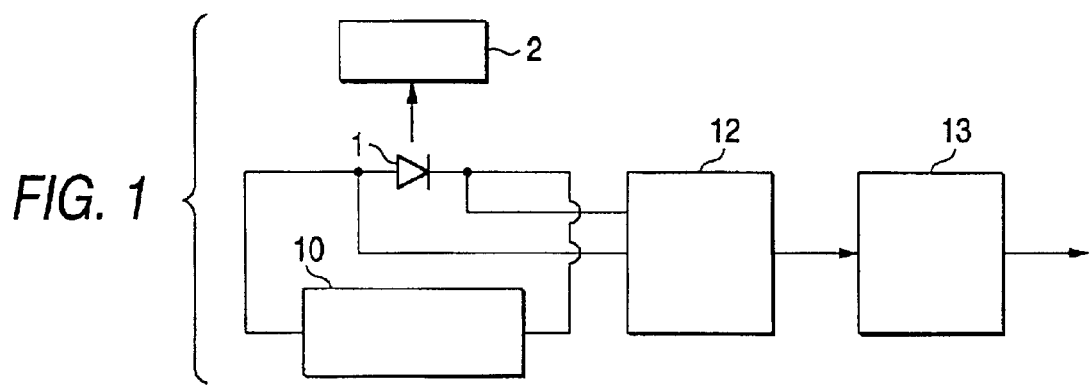
FIG. 1 is a diagram showing a structure of an essential portion of a solid-state laser device according to a first embodiment of the present invention.

FIG. 1 is a diagram showing a structure of an essential portion of a solid-state laser device according to a first embodiment of the present invention. A laser diode 1 is connected to a direct-current power source 10. Excitation light emitted from the laser diode 1 is applied to a solid-state laser medium 2. Further, a wiring for measuring the voltage of the laser diode 1 is installed in the laser diode 1 and the voltage of the laser diode 1 is measured by a voltage measurement unit 12. The voltage measured by the voltage measurement unit 12 is transmitted to a fault determination unit 13, which is as an abnormality detection unit, to be compared with an upper limit value and a lower limit value that are set in advance. When being determined a fault, the fault determination unit 13 outputs a fault signal.

Figure 2:
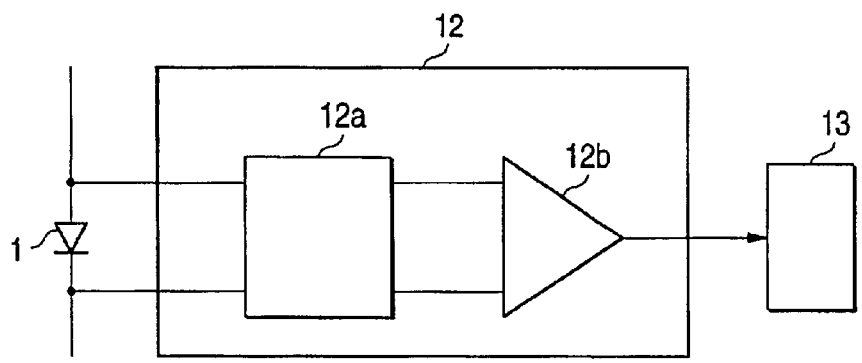
FIG. 2 is a diagram showing a structure of a voltage measurement unit of the solid-state laser device according to the first embodiment of the present invention.

FIG. 2 is a diagram showing a structure of the voltage measurement unit 12 shown in FIG. 1. The wiring from the laser diode 1 is insulated by an insulating amplifier 12a. Thereafter, the wiring is led to the fault determination unit 13 via a gain adjustment amplifier 12b to adjust to an appropriate voltage.

Figure 3:
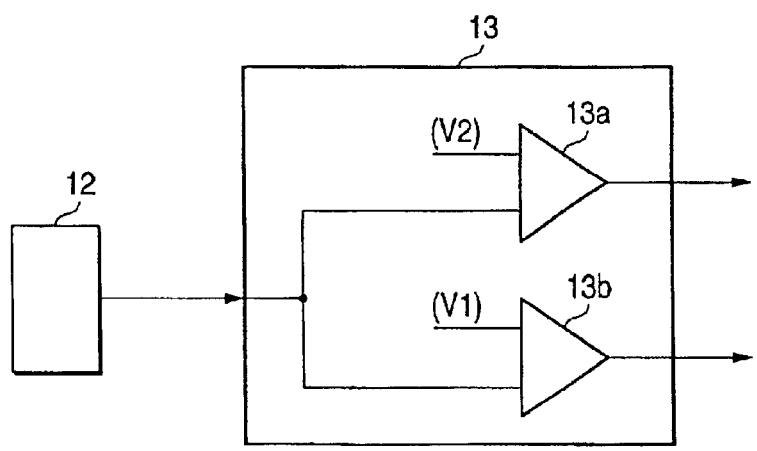
FIG. 3 is a diagram showing a structure of a fault determination unit of the solid-state laser device according to the first embodiment of the present invention.

FIG. 3 is a diagram showing a structure of the fault determination unit 13 shown in FIG. 1. The voltage at the laser diode 1 received from the voltage measurement unit 12 is compared with an upper limit value V2 by a voltage upper limit comparison unit 13a. When the voltage at the laser diode 1 is equal to or higher than the upper limit value V2, a fault signal is output externally. Further, the voltage at the laser diode 1 received from the voltage measurement unit 12 is compared with a lower limit value V1 by a voltage lower limit comparison unit 13b. When the voltage is equal to or lower than the lower limit value V1, similar to the above, a fault signal is output externally.

The operation of the solid-state laser device will now be described.

A current is supplied to the laser diode 1 by the direct-current power source 10. According to this supplied current, a constant voltage, which is determined in accordance with the voltage-current characteristic of the laser diode 1, is generated between the ends of the laser diode 1. The voltage generated at both ends is fetched in the voltage measurement unit 12, and is insulated from the main circuit power source by the insulating amplifier 12a. The voltage at both ends of the insulated laser diode 1 is then adjusted to the appropriate voltage by the gain adjustment amplifier 12b.

The voltage at the laser diode 1, which is adjusted to the appropriate value, is compared with the upper limit value V2 by the voltage upper limit comparison unit 13a in the fault determination unit 13. When the adjusted voltage at both ends of the laser diode 1 is equal to or higher than the upper limit value V2, the fault signal is output externally. The voltage at the laser diode 1 is then compared with the lower limit value by the voltage lower limit comparison unit 13b. When the voltage is equal to or lower than the lower limit value V1, as in the above case, the fault signal is output externally.

Figure 12:
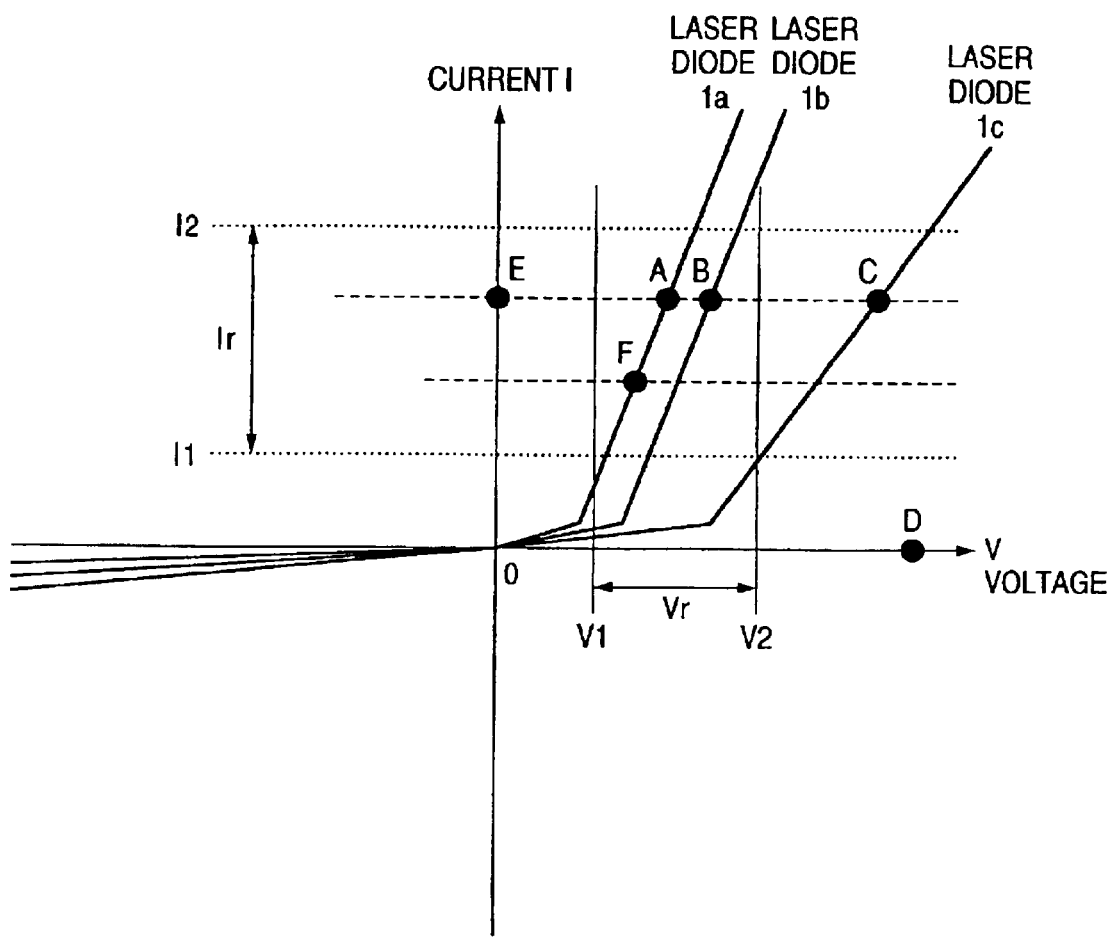
FIG. 12 is a voltage-current characteristic graph for the laser diode.

For example, when the laser diode 1 is opened, as is shown by a point D in FIG. 12, a power source voltage is applied at both ends of the laser diode 1. Therefore, when the upper limit value V2 of the voltage is lower than the power source voltage, the open state can be detected. On the other hand, when the laser diode 1 is short-circuited, as indicated by a point E in FIG. 12, the voltage at both ends of the laser diode 1 is 0 V. Therefore, when the lower limit value V1 is slightly higher than 0 V, a short-circuit state is detected.

As indicated by points A and F in FIG. 12, the voltage generated at both ends of the laser diode 1 is changed depending on a supplied current value. Further, even when a current having the same current value is flowing, as indicated by points A and B in FIG. 12, the voltage generated at both ends is changed depending on a difference among individual laser diodes. Thus, the upper limit value V2 and the lower limit value V1 are set as determination values. As indicated by Vr in FIG. 12, the values for determining normality have a range to enable to accurately detect a fault at the laser diode 1.

For example, assuming that the voltage-current (V-I) characteristic between the laser diode 1a and the laser diode 1b is as shown in FIG. 12, the lower limit value V1 and the upper limit value V2 are set and the characteristic is shifted to point E or D upon the occurrence of a short circuit or an open fault, so that faults at the laser diodes 1a and 1b can be detected.

Further, since the upper limit value V2 and the lower limit value V1 are provided, not only short circuit and an open fault at the laser diode 1 can be detected, but also since in case that the laser diode 1c shown in FIG. 12 that greatly differs in the voltage-current characteristic, the point is shifted to a point C, the laser diode 1 which differs in the voltage-current characteristic can be detected. This means that when the current value is constant, the laser diode 1 having a different current value can be detected and that a difference in the amount of excitation light generated by the laser diode 1 can be detected.

In this embodiment, only one laser diode 1 is employed; however, the same operation is performed for two or more laser diodes connected in series. The upper limit value is slightly lower than the power source voltage, and whereby when one of the plurality of laser diodes is opened, the fault can be detected. Assuming that a method for setting the lower limit value as follows, a short circuit at one laser diode can be detected. For example, when four laser diodes are connected in series and the voltage at one laser diode is 2 V, the voltage for all the laser diodes is 8 V. When one of the four laser diodes is short-circuited, the voltage for all the laser diodes is 6 V. Accordingly, in case of detecting a short circuit at one laser diode, the lower limit value need only be set to 7 V. As described above, the upper limit value and the lower limit value are appropriately set, and whereby even if two or more laser diodes are connected in series, an abnormality at one laser diode can be detected.

Embodiment 2

As described in the first embodiment, the upper limit value and the lower limit value can be set to detect an abnormality at a specific laser diode 1 when two or more laser diodes 1 are connected in series. However, when the number of the laser diodes 1 to be connected in series is increased, for the following reasons it is difficult to detect a fault at only one of the laser diodes 1. Therefore, it is necessary to use a different method to detect a fault at one specific laser diode 1.

As shown in FIG. 12, even if the individual laser diodes 1 are supplied the same current value, the voltages generated at both ends differ. Thus, when the number of the laser diodes 1 connected in series is increased, a large range must be set for determining normality. For example, assuming that the voltages at the individual laser diodes 1 vary from 2 V to 2.3 V in the normal state, when these laser diodes 1 are connected in series, the total voltage of all the laser diodes 1 must fall in the range of 20 V to 23 V. Therefore, a range must be set, for determining normality, 20 V to 23 V. On the other hand, in case that the voltage generated at both ends of each of ten laser diodes 1 connected in series is 2.3 V, if one of the laser diodes 1 is short-circuited, the total voltage is 23 V−2.3 V=20.7 V. However, since the normal range is set from 20 V to 23 V, 20.7 V is determined to be a voltage in the normal range, the fault of only one laser diode 1 can not be detected.

Figure 4:
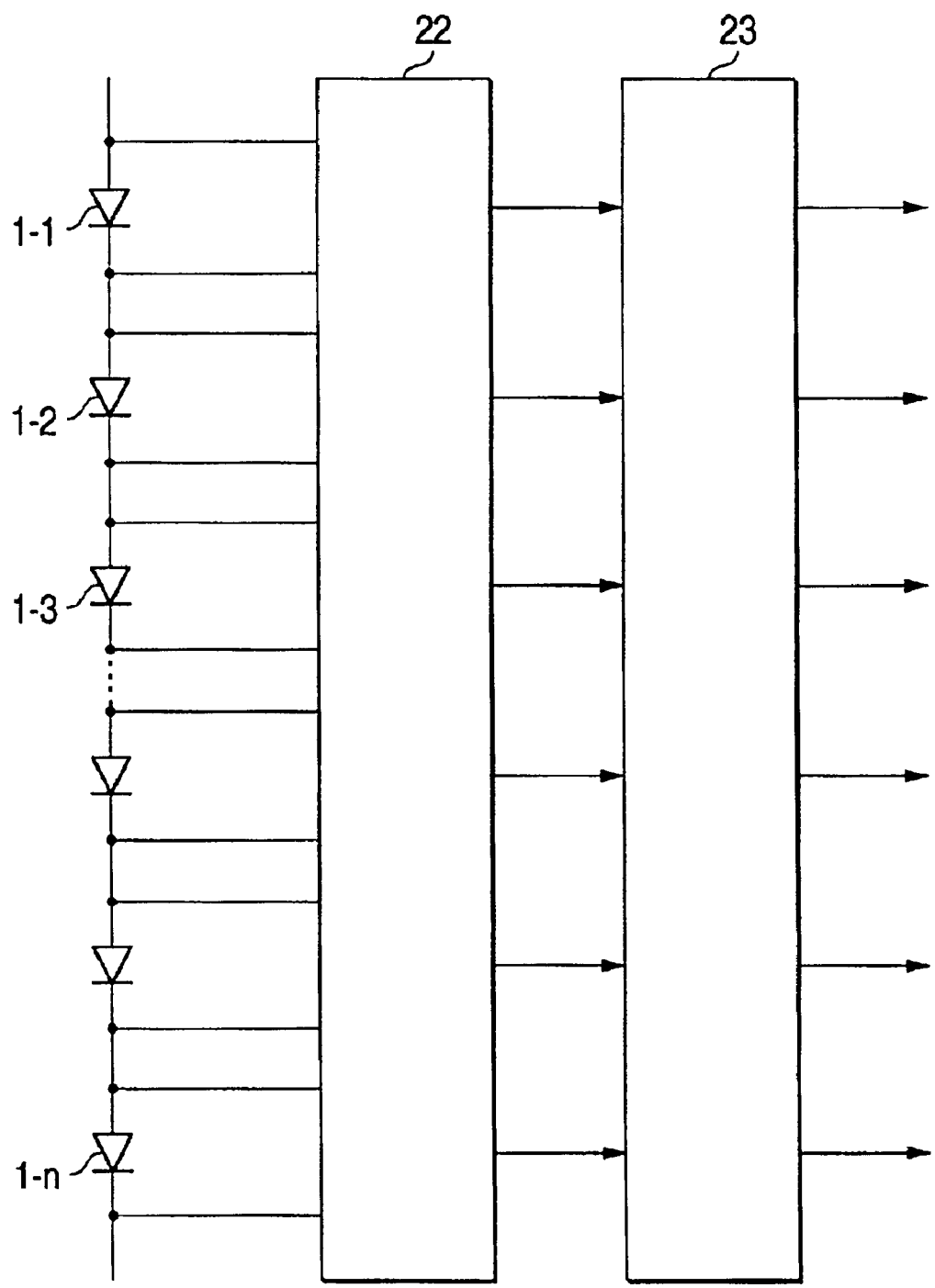
FIG. 4 is a diagram showing a structure of an essential portion of a solid-state laser device according to a second embodiment of the present invention.

FIG. 4 is a diagram showing a structure of an essential portion of a solid-state laser device according to the second embodiment of the invention. n laser diodes 1 (1-1, 1-2, . . . 1-n) are connected in series to a direct-current power source (not shown). The voltages at the individual laser diodes 1 are measured by the voltage measurement unit 22, and the occurrence of a fault is determined for each laser diode 1 by the fault determination unit 23. The measurement and detection operations for the laser diode in this embodiment are basically the same as those in the above described first embodiment. However, since the determination of a fault is performed for each laser diode 1, a fault signal is output for each laser diode 1, so that the laser diode 1 in which the fault has occurred can be pinpointed.

Since the solid-state laser device of the second embodiment measures the voltage of each laser diode 1, the upper limit value and the lower limit value need only be set as for one laser diode 1 as explained in the first embodiment, so that when two or more laser diodes are connected in series, the occurrence of a fault at one specific laser diode 1 can be detected.

Embodiment 3

Figure 5:
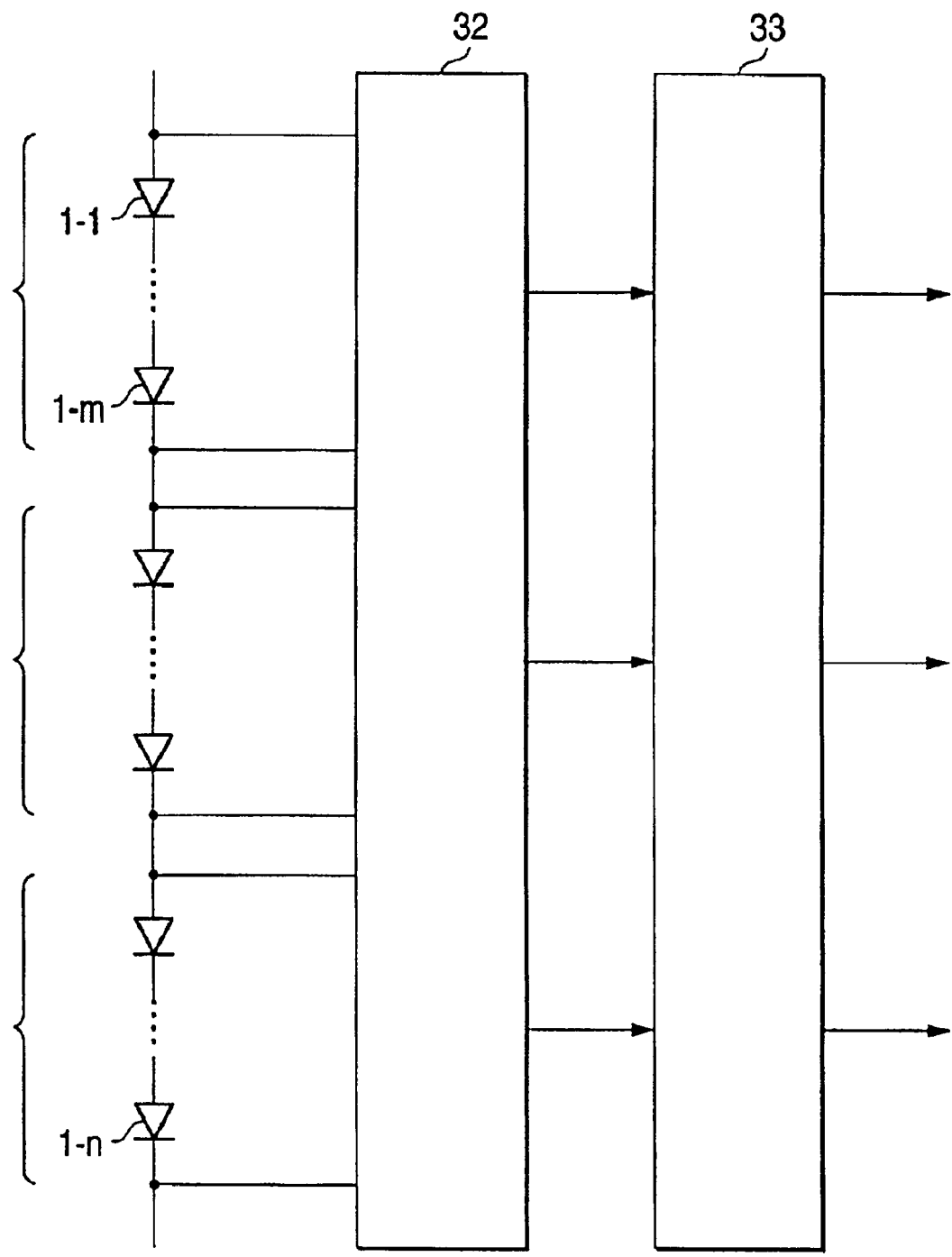
FIG. 5 is a diagram showing a structure of an essential portion of a solid-state laser device according to a third embodiment of the present invention.

FIG. 5 is a diagram showing a structure of an essential portion of a solid-state laser device according to a third embodiment. n laser diodes 1 are connected in series to a direct-current power source 10. When a plurality of these laser diodes 1 (in this case, m laser diodes are grouped together as one set) are grouped together in sets, the voltage of each set is measured by a voltage measurement unit 32, and the occurrence of a fault is determined for each set of the laser diodes 1 using a fault determination unit 33. The measurement and detection operations of this embodiment are also basically the same as in the first and second embodiments.

When the solid-state laser device in the third embodiment is compared with the one in the second embodiment, the number of wiring and the controllers for the measurements can be reduced. In addition, when m laser diodes are selected in the following manner, substantially the same functions as in the second embodiment can be realized.

An explanation will now be given for a case wherein ten of the laser diodes 1 having the same characteristic as in the second embodiment, i.e., ten laser diodes 1 at both ends of which the voltage varies from 2.0 V to 2.3 V, are connected in series. When the total voltage is measured merely for ten laser diodes 1 connected in series, a fault at only one laser diode cannot be detected, as explained in the second embodiment. However, when a measurement is performed for each of five laser diodes (m=5), as in the third embodiment, the total of the voltages of the five laser diodes is 10.0 V to 11.5 V. Therefore, a normal range must be set from 10.0 V to 11.5 V. On the other hand, assuming that all of the five laser diodes connected in series have 2.3 V, and when only one of them is short-circuited, the total voltage is 11.5 V–2.3 V =9.2 V. Thus, since the voltage falls out of the normal range, a fault at only one laser diode can be detected.

Figure 6:
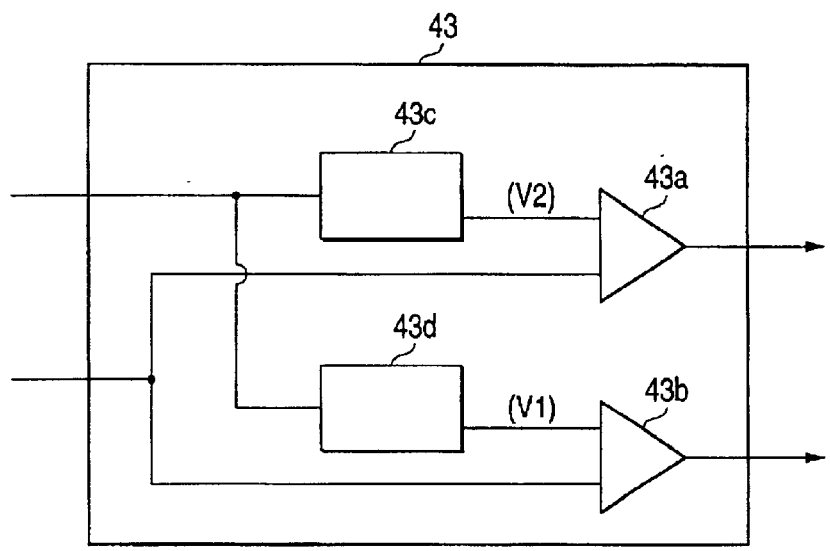
FIG. 6 is a schematic diagram showing a structure of another fault determination unit of the solid-state laser device of the present invention.
Figure 7:
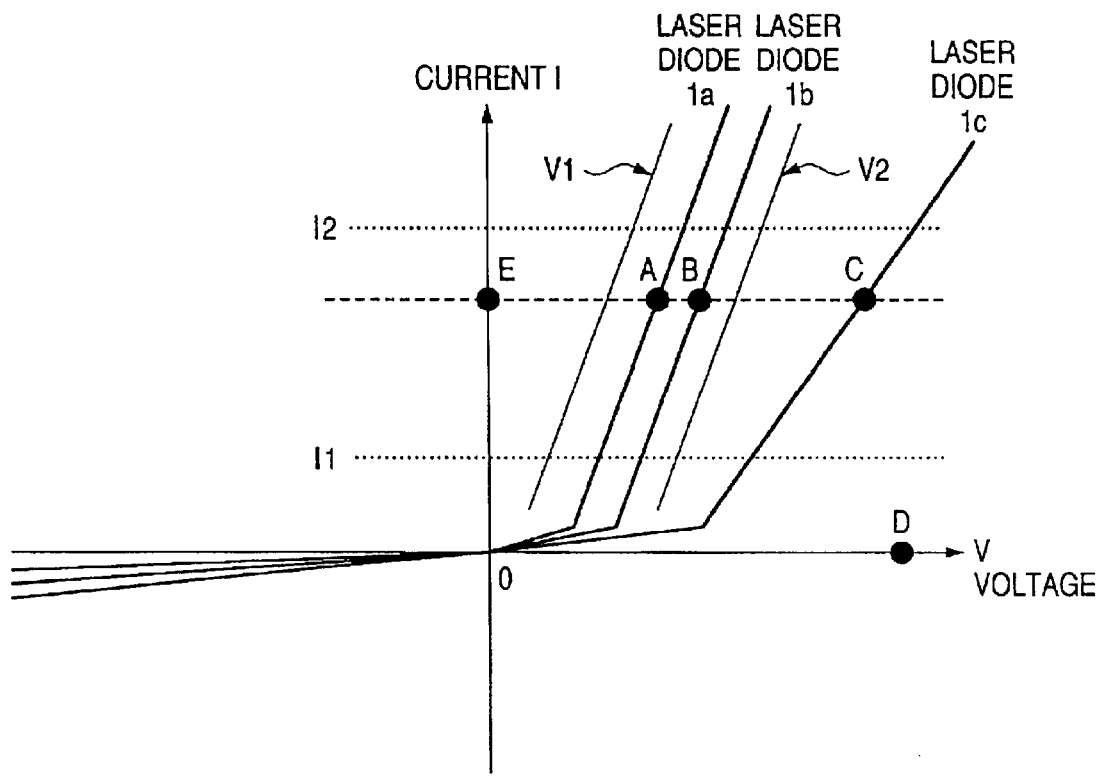
FIG. 7 is a voltage-current characteristic graph for a laser diode.
Figure 8:
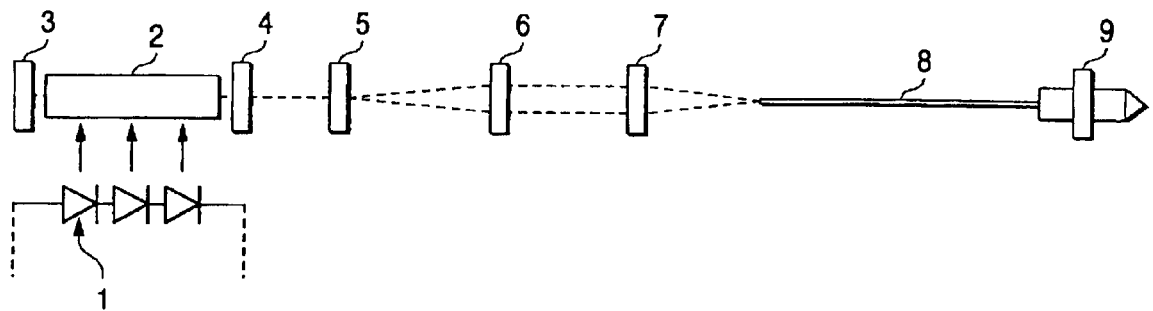
FIG. 8 is a diagram showing a structure of a common solid-state laser device according to a related art.
Figure 9:
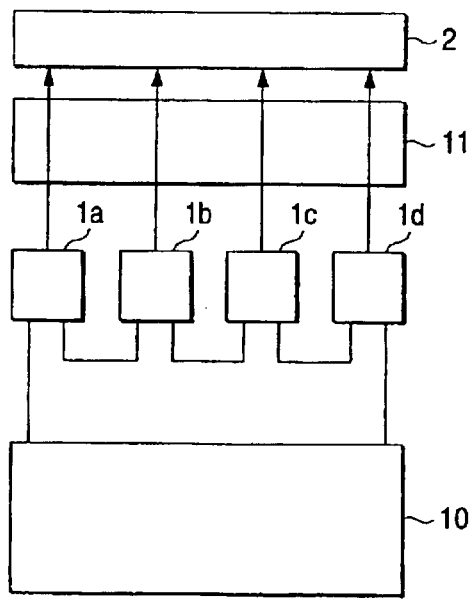
FIG. 9 is a diagram showing a structure of an essential portion of the common solid-state laser device according to the related art.
Figure 10:
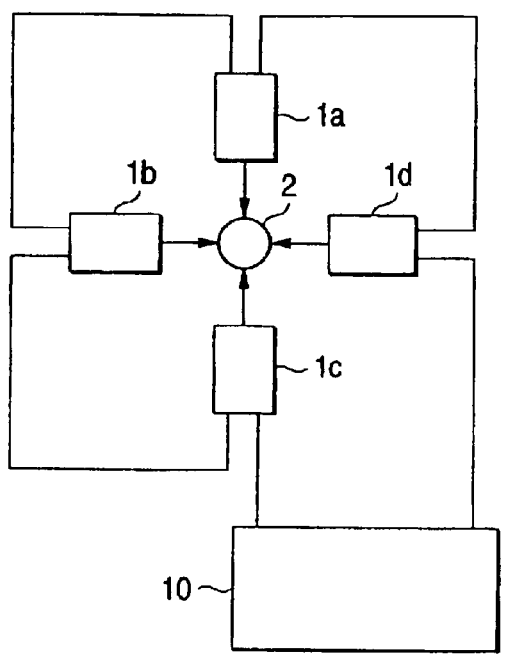
FIG. 10 is a diagram showing a structure of an essential portion of another common solid-state laser device according to a related art.
Figure 11:
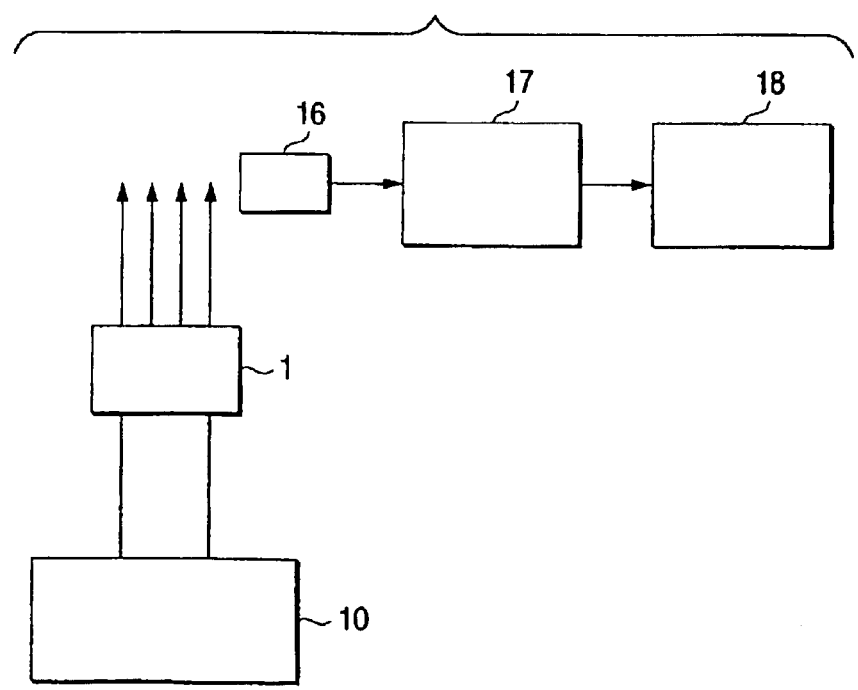
FIG. 11 is a schematic structural diagram for explaining fault detection mechanism of a laser diode of the conventional solid-state laser device.

FIG. 6 is a schematic diagram showing a structure of the fault determination unit when the voltage range for a determination of normality varies depending on an input current. The voltage at the laser diode 1 is changed depending on the current flow. At a fault determination unit 43 in FIG. 6, based on the value of the input current, the upper limit value V2 to be input to an upper voltage limit comparison unit 43$a$ and the lower limit value V1 to be input to a lower voltage comparison unit 43$b$ are changed by an upper limit value change operation unit 43$c$ and a lower limit value change operation unit 43$d$, which are reference value change unit, respectively. In this case, the voltage range for the determination of normality is shown in FIG. 7.

When a plurality of laser diodes 1 are employed, the upper limit value and the lower limit value can be independently set in accordance with the current value supplied to the individual laser diodes 1.

The reliability is further increased when, in addition to the current value, a condition such as the temperature of the laser diode 1, which can be a factor that changes the voltage of the laser diode, is used as an input condition for varying the upper limit value and the lower limit value.

According to the present invention, upon the occurrence of an open fault, the voltage at a laser diode is raised to the power source voltage, or upon the occurrence of a short-circuit, the voltage is dropped to 0 V. Therefore, when the upper limit value that is set in advance is compared with the voltage measured at the laser diode, and when the voltage exceeds the upper limit value, it can be ascertained that an open fault has occurred. When the lower limit value that is set in advance is compared with the voltage measured at the laser diode, and when the voltage does not reach the lower limit value, it can be ascertained that a short circuit has occurred. In this manner, an abnormality at the laser diode can be detected.

Furthermore, according to the present invention, an abnormality at a laser diode can be detected while a separate member, such as a photodiode, need not be located on the periphery of the solid laser medium and the laser diode, the device is not increased in size and is not complicated, and a reduction in the laser emission efficiency due, for example, to the absorption of part of the excitation light by the photodiode does not occur.

In addition, since two or more laser diodes are connected in series, the voltage is measured at each laser diode, so that a laser diode whereat an abnormality has occurred can be pinpointed.

Industrial Applicability

As is described above, the solid-state laser device of the present invention is appropriate for the user of, for example, an industrial laser machine.

What is claimed is:

1. A solid-state laser diode comprising:

a laser diode for exciting a solid laser medium;

a constant current source for supplying a constant current to the laser diode;

voltage measurement unit for measuring a voltage at both ends of the laser diode; and abnormality detection unit for detecting an abnormality at the laser diode based on an output of the voltage measurement unit.

2. A solid-state laser device comprising:

a plurality of laser diodes connected in series, for exciting a solid laser medium;

a constant current source for supplying a constant current to the laser diodes;

voltage measurement means for measuring the voltage at both ends of the laser diodes; and abnormality detection unit for detecting an abnormality at the laser diodes based on the output of the voltage measurement unit.

3. The solid-state laser device according to claim 2, wherein the voltage measurement unit measures the voltage of the plurality of laser diodes individually to output the individual measured voltage to the abnormality detection unit.

4. The solid-state laser device according to claim 2, wherein when n (n is a natural number equal to or greater than four) laser diodes are connected, the voltage measurement unit measures the voltages of sets including m laser diodes (m is a natural number smaller than n) individually to output the voltages to abnormality detection unit.

5. The solid-state laser device according to claim 1, wherein a normal range having a finite width defined an upper limit value and a lower limit value as reference values of the voltage for determining abnormality of the laser diode is set; and when the voltages at the laser diodes measured by the voltage measurement unit are equal to or higher than the upper limit value or equal to or lower than the lower limit value, the abnormality detection unit outputs an abnormality detection signal.

6. The solid-state laser device according to claim 5, further comprising:

reference value change unit for changing the normal range for the measured voltage set at the abnormality detection means on a basis of an input current value.

* * * * *